(12) United States Patent
Yamaguchi et al.

(10) Patent No.: US 10,086,583 B2
(45) Date of Patent: Oct. 2, 2018

(54) STACK, METHOD FOR TREATING SUBSTRATE MATERIAL, TEMPORARY FIXING COMPOSITION, AND SEMICONDUCTOR DEVICE

(71) Applicant: JSR CORPORATION, Tokyo (JP)

(72) Inventors: Torahiko Yamaguchi, Tokyo (JP); Hiroyuki Ishii, Tokyo (JP); Katsumi Inomata, Tokyo (JP)

(73) Assignee: JSR CORPORATION, Tokyo (JP)

( * ) Notice: Subject to any disclaimer, the term of this patent is extended or adjusted under 35 U.S.C. 154(b) by 112 days.

(21) Appl. No.: 15/038,738

(22) PCT Filed: Oct. 30, 2014

(86) PCT No.: PCT/JP2014/078908
§ 371 (c)(1),
(2) Date: May 24, 2016

(87) PCT Pub. No.: WO2015/079863
PCT Pub. Date: Jun. 4, 2015

(65) Prior Publication Data
US 2016/0375652 A1    Dec. 29, 2016

(30) Foreign Application Priority Data

Nov. 26, 2013  (JP) .................................. 2013-243800

(51) Int. Cl.
*B32B 7/06*    (2006.01)
*B32B 7/12*    (2006.01)
(Continued)

(52) U.S. Cl.
CPC .................. *B32B 7/06* (2013.01); *B32B 7/12* (2013.01); *B32B 27/08* (2013.01); *B32B 27/18* (2013.01);
(Continued)

(58) Field of Classification Search
USPC .................. 156/247, 307.1, 307.3, 701, 714
See application file for complete search history.

(56) References Cited

U.S. PATENT DOCUMENTS 9,334,424 B2 *  5/2016  Tanabe ................ H01L 21/6835
2013/0029145 A1  1/2013  Kato et al.
(Continued)

FOREIGN PATENT DOCUMENTS

JP  H01-168996  7/1989
JP  2013-048215  3/2013
(Continued)

OTHER PUBLICATIONS

"International Search Report (Form PCT/ISA/210) of PCT/JP2014/078908", dated Jan. 27, 2015, with English translation thereof, pp. 1-2.
(Continued)

*Primary Examiner* — Sing P Chan
(74) *Attorney, Agent, or Firm* — JCIPRNET

(57) ABSTRACT

There is shown a stack including a substrate material temporarily fixed on a support via a temporary fixing material, wherein the temporary fixing material includes a temporary fixing material layer (I) in contact with the support-facing surface of the substrate material, and a temporary fixing material layer (II) formed on the support-facing surface of the layer (I), wherein the temporary fixing material layer (I) is formed of a temporary fixing composition containing a polymer (A) and a release agent (B) which contains a functional group capable of reacting with the polymer (A) to form a chemical bond.

5 Claims, 1 Drawing Sheet

(51) Int. Cl.
    *B32B 27/08*     (2006.01)
    *B32B 27/18*     (2006.01)
    *B32B 27/30*     (2006.01)
    *B32B 27/36*     (2006.01)
    *B32B 37/26*     (2006.01)
    *B32B 38/10*     (2006.01)
    *B32B 43/00*     (2006.01)
    *C09J 165/00*     (2006.01)
    *H01L 21/683*     (2006.01)
    *B32B 37/12*     (2006.01)

(52) U.S. Cl.
    CPC ............ *B32B 27/308* (2013.01); *B32B 27/36* (2013.01); *B32B 37/1284* (2013.01); *B32B 38/10* (2013.01); *B32B 43/006* (2013.01); *C09J 165/00* (2013.01); *H01L 21/6835* (2013.01); *H01L 21/6836* (2013.01); *B32B 2037/268* (2013.01); *B32B 2307/748* (2013.01); *B32B 2457/14* (2013.01); *C08G 2261/3324* (2013.01); *C08G 2261/418* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01)

(56) References Cited

U.S. PATENT DOCUMENTS

2013/0108866 A1      5/2013      Kato et al.
2013/0220687 A1      8/2013      Tagami et al.

FOREIGN PATENT DOCUMENTS

| | | |
|---|---|---|
| JP | 2013-110391 | 6/2013 |
| JP | 2013-179135 | 9/2013 |
| JP | 2013-222761 | 10/2013 |
| JP | 2013-232459 | 11/2013 |

OTHER PUBLICATIONS

"Office Action of Japan Counterpart Application," with English translation thereof, dated May 23, 2017, p. 1-p. 3.

* cited by examiner

STACK, METHOD FOR TREATING SUBSTRATE MATERIAL, TEMPORARY FIXING COMPOSITION, AND SEMICONDUCTOR DEVICE

CROSS-REFERENCE TO RELATED APPLICATION

This application is a 371 application of the international PCT application serial no. PCT/JP2014/078908, filed on Oct. 30, 2014, which claims the priority benefit of Japan application no. 2013-243800, filed on Nov. 26, 2013. The entirety of each of the abovementioned patent applications is hereby incorporated by reference herein and made a part of this specification.

TECHNICAL FIELD

The present invention relates to a stack including a substrate material temporarily fixed on a support via a temporary fixing material, a method for treating the substrate material, a feedstock composition for a temporary fixing material that can be suitably used to fix temporarily the substrate material on the support in treating the substrate material, and a semiconductor device.

BACKGROUND ART

There has been proposed a method for bonding a substrate material such as a semiconductor wafer to a support such as a glass substrate via a temporary fixing material and then performing processes such as back-grinding of the substrate material and formation of back electrodes. It is necessary that the temporary fixing material be able to temporarily fix the substrate material on the support during processing and that the substrate material be readily separated from the support after the processing. Two-layered or three-layered systems have been proposed for such a temporary fixing material in consideration of properties such as adhesiveness, peelability, and heat resistance thereof (see, for example, Patent Documents 1-3).

Patent Document 1 discloses a wafer processing laminate including a support, a temporary adhesive layer on the support, and a wafer laid on the temporary adhesive layer, the wafer having a circuit-forming front surface and a back surface to be processed. The temporary adhesive layer includes a first temporary bond layer, which is a non-reactive thermoplastic organosiloxane polymer layer (A) that is releasably bonded to the front surface of the wafer, and a second temporary bond layer, which is a thermosetting modified siloxane polymer layer (B) that is laid on the first temporary bond layer and that is releasably bonded to the support.

RELATED ART DOCUMENTS

Patent Documents

Patent Document 1: JP 2013-048215 A
Patent Document 2: JP 2013-110391 A
Patent Document 3: JP 2013-179135 A

SUMMARY OF INVENTION

Technical Problem

Through their research, the inventors of the present invention have found that temporary fixing materials of multilayered systems such as traditional two-layered systems cause migration of a release agent contained in a layer in contact with a substrate material to other layers such as a layer in contact with a support, degradation of peelability, separation in an unwanted region on the substrate material, and a large amount of the temporary fixing material remaining on the substrate material. In this case, it results in taking a long time to remove the remaining temporary fixing material.

The present invention is to achieve, in temporary fixing materials of multilayered system such as of two-layered system, prevention of a release agent contained in a layer in contact with the substrate material from migrating into other layers such as a layer in contact with the support, and reduction of an amount of the temporary fixing material remaining on the substrate material when the substrate material is separated from the support.

Solution to Problem

The inventors of the present invention have carried out assiduous research intended to solve the problem described above. As a result, they have found that the problem can be solved by a stack and treatment method configured as described below, thereby completing the present invention.

The present invention relates to, for example, following aspects [1]-[10].

[1] A stack including a substrate material fixed temporarily on a support via a temporary fixing material, wherein the temporary fixing material includes a temporary fixing material layer (I) in contact with the support-facing surface of the substrate material, and a temporary fixing material layer (II) formed on the support-facing surface of the layer (I), wherein the temporary fixing material layer (I) is formed of a temporary fixing composition including a polymer (A) and a release agent (B) which contains a functional group capable of reacting with the polymer (A) to form a chemical bond.

[2] The stack according to [1], wherein the release agent (B) is at least one selected from a silicone release agent (B1), a fluorinated release agent (B2), and an aliphatic release agent (B3).

[3] The stack according to [1] or [2], wherein the release agent (B) has at least one of structure selected from a diaryl silicone structure, a dialkyl silicone structure, a fluorinated alkyl structure, a fluorinated alkenyl structure, and a $C_8$ or higher alkyl structure, and contains a functional group capable of reacting with the polymer (A) to form a chemical bond.

[4] The stack according to any one of [1] to [3], wherein the functional group which is contained in the release agent (B) and is capable of reacting with the polymer (A) to form a chemical bond is a group containing a polymerizable double-bond.

[5] The stack according to [4], wherein the polymer (A) is at least one selected from a diene polymer containing a polymerizable double-bond, an alkyl ester (meth)acrylate polymer containing a polymerizable double-bond, and a polysiloxane containing a polymerizable double-bond.

[6] The stack according to any one of [1] to [5], wherein the temporary fixing material layer (II) is formed of a temporary fixing composition which includes at least one resin selected from a thermoplastic resin (C) and a thermosetting resin (D), and which substantially does not include the release agent (B) containing a functional group capable of reacting with the polymer (A) to form a chemical bond.

[7] A method for treating a substrate material, including <1> a step of obtaining a stack by fixing temporarily a substrate material on a support via a temporary fixing material including a temporary fixing material layer (I) in contact with the support-facing surface of the substrate material and a temporary fixing material layer (II) formed on the support-facing surface of the layer (I), wherein the temporary fixing material layer (I) is formed of a temporary fixing composition including a polymer (A) and a release agent (B) which contains a functional group capable of reacting with the polymer (A) to form a chemical bond; <2> a step of processing the substrate material, and/or transporting the stack; and <3> a step of separating the substrate material from the support.

[8] A temporary fixing composition including a polymer (A) and a release agent (B) which contains a functional group capable of reacting with the polymer (A) to form a chemical bond.

[9] The temporary fixing composition according to [8], wherein the release agent (B) has at least one structure selected from a diaryl silicone structure, a dialkyl silicone structure, a fluoridated alkyl structure, a fluoridated alkenyl structure, and a $C_8$ or higher alkyl structure, and contains the functional group capable of reacting with the polymer (A) to form a chemical bond.

[10] A semiconductor device obtained by the method for treating a substrate material according to [7].

Advantageous Effects of Invention

The present invention can achieve, in temporary fixing materials of multilayered system such as of two-layered system, prevention of a release agent contained in a layer in contact with the substrate material from migrating into other layers such as a layer in contact with the support, and reduction of an amount of the temporary fixing material remaining on the substrate material when the substrate material is separated from the support.

DESCRIPTION OF EMBODIMENTS

Now, a stack according to the present invention, a temporary fixing material, and a temporary fixing composition, which is a feedstock composition for the temporary fixing material, will be described, and then, a method for treating a substrate material by using the temporary fixing material, and a semiconductor device obtained by the method for treating the substrate material will be also described.

As used herein, the term "temporary fixing material" refers to a material that is used to fix temporarily a substrate material on a support so that the substrate material may not move and slide relative to the support during processing and/or transportation of the substrate material. Examples of the processing include dicing; back-grinding; and photo-fabrication processing such as resist-patterning, formation of metal bumps by plating or the like, film formation by chemical vapor deposition or the like, and reactive ion etching (RIE). Examples of the transportation include transportation of substrate materials between apparatuses.

1. Stack and Temporary Fixing Material

The stack of the present invention includes a substrate material fixed temporarily on a support via a temporary fixing material, and the temporary fixing material includes a temporary fixing material layer (I) in contact with the support-facing surface of the substrate material and a temporary fixing material layer (II) formed on the support-facing surface of the layer (I).

The temporary fixing material layer (I) can be formed by using a temporary fixing composition (I) including a polymer (A) and a release agent (B) which contains a functional group capable of reacting with the polymer (A) to form a chemical bond, as will be described below. In the present invention, separation at the boundary between the substrate material and the layer (I) or separation due to cohesive failure in the layer (I) mainly occurs when the substrate material is separated from the support. The temporary layer (I) will be hereinafter also referred to as "release layer (I)."

The temporary fixing material layer (II) is a layer for fixing temporarily the substrate material to the support and substantially does not include the release agent (B) containing a functional group capable of reacting with the polymer (A) to form a chemical bond. The layer (II) can be formed with a temporary fixing composition (II) as will be described below which substantially does not include the release agent (B). The layer (II) is hereinafter also referred to as "adhesive layer (II)."

In the present invention, the temporary fixing material includes an adhesive layer (II) and a release layer (I) formed on the layer (II). The adopted configuration which includes two or more layers as a temporary fixing material has an advantage that it can satisfies all functions in trade-off relations with each other, such as relations between adhesiveness, peelability, and heat resistance necessary for the temporary fixing material.

Figure 1:
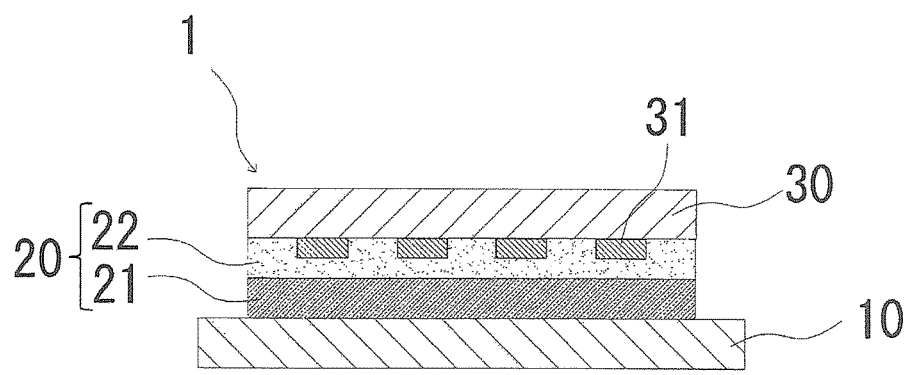
FIG. 1 is a cross-sectional view of a stack according to an embodiment of the present invention.

FIG. 1 illustrates an example of a stack according to the present invention. The stack 1 includes a support 10, a temporary fixing material 20 formed on the support 10, and a substrate material 30 which is temporary fixed on the support 10 by the temporary fixing material 20 and which has a bump 31 thereon. The temporary fixing material 20 includes an adhesive layer 21 in contact with the support 10, and a release layer 22 which is formed on the adhesive layer 21 and which is in contact with the substrate material 30. FIG. 1 is simply one example of the stack of the present invention, and other layers may be provided in addition to, for example, the adhesive layer 21 and the release layer 22.

Figure 2:
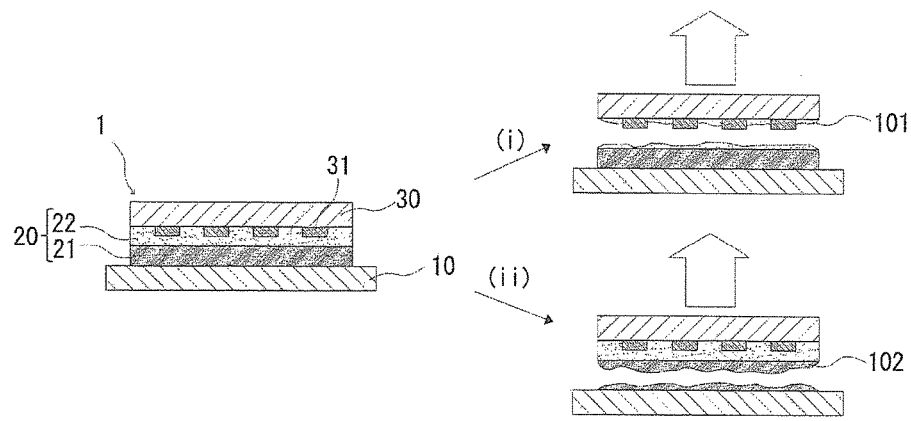
FIG. 2 explains a temporary fixing material residual when a substrate material is separated from a support.

FIG. 2 illustrates exemplary separation forms which occur during the separation of the substrate material from the support in the stack according to the present invention.

When the release layer 22 is formed of the temporary fixing composition containing polymer (A) and the release agent (B) which contains a functional group capable of reacting with the polymer (A) to form a chemical bond, it is inferred that the polymer (A) reacts with the release agent (B) at high temperature during formation of the release layer 22 or processing the substrate material and that migration of a component of the release agent contained in the release layer 22 into the adhesive layer 21 is prevented, resulting in conservation of the peelability of the release layer 22. Accordingly, when the substrate material 30 is separated, for example, in a direction perpendicular to the substrate surface, as is shown in FIG. 2(i), separation at the boundary between the substrate material 30 and the release layer 22 or separation due to cohesive failure in the release layer 22 occurs, enabling reduction of a residue 101 derived from a temporary fixing material remaining on the substrate material 30. Even if the residue remains, it can be removed in a short time by using a solvent.

On the other hand, when the release layer 22 is formed of a temporary fixing composition including a polymer (A) and only a release agent (B'), as a release agent, which does not contain a functional group capable of reacting with the polymer (A) to form a chemical bond, it is inferred that the component of the release agent contained in the release layer 22 migrates into the adhesive layer 21, causing degradation of the peelability of the release layer 22. Accordingly, as shown in FIG. 2 (ii), when the substrate material 30 is separated, for example, in a direction perpendicular to the substrate surface, separation at the boundary between the support 10 and the adhesive layer 21 or separation due to cohesive failure in the adhesive layer 21 occurs, causing a large amount of residue 102 derived from the temporary fixing material on the substrate material 30. Accordingly, it tends to take a longer time to remove the residue by using a solvent.

Although the temporary fixing material may include any other layer in addition to the release layer (I) and the adhesive layer (II), it is preferably a two-layered temporary fixing material consisting of the release layer (I) and the adhesive layer (II).

The total thickness of the temporary fixing material may be selected as desired depending on the size of a temporary fixation surface of a substrate material and strength of the adhesiveness to be needed during processing or the like. The temporary fixing material usually has a total thickness of more than 0.1 μm and 2 mm or less, preferably more than 0.1 μm and 1 mm or less, and more preferably more than 0.1 μm and 0.5 mm or less. The release layer (I) and the adhesive layer (II) each usually have a thickness of 0.1-200 μm, preferably 1-150 μm, and more preferably 10-120 μm. When these thicknesses are within the respective ranges described above, retention of the temporary fixing material is sufficient, and the substrate material does not separate from the temporary fixation surface during processing or transportation.

In the present invention, a resin constituting the temporary fixing material can be adequately chosen not only to fix temporarily the substrate material on the support, for example, at a temperature of 300° C. or less but also to retain the substrate material on the support even under high temperature environments such as solder reflow (example: 225° C. or more, specifically 225-300° C.). Further, the temporary fixing material can withstand shear force applied by, for example, back-grinding carried out, for example, within a temperature range of 0-100° C., and can retain the substrate material on the support.

The temporary fixing material can retain the substrate material on the support also in thinning of the substrate material carried out at approximately 25° C., photo-fabrication, such as etching processing and formation of a sputtered film within a temperature range of 25-300° C., plating process and reflow plating carried out within a temperature range of 225-300° C., and so on.

The temporary fixing material as described above is suitably used to fix temporarily a substrate material in various processes in current economic activities, such as, for example, micromachining of various material surfaces, various surface mounting processes, and conveyance of semiconductor wafers and semiconductor elements.

2. Temporary Fixing Composition

The release layer (I) can be formed by using, for example, a temporary fixing composition (I) of the invention including a polymer (A) and a release agent (B) which contains a functional group capable of reacting the polymer (A) to form a chemical bond. The adhesive layer (II) can be formed by using, for example, a temporary fixing composition (II) which substantially does not include a release agent (B) containing a functional group capable of reacting the polymer (A) to form a chemical bond.

2-1. Temporary Fixing Composition (I)

The temporary fixing composition (I) of the present invention includes a polymer (A) and a release agent (B) which contains a functional group capable of reacting with the polymer (A) to form a chemical bond. More preferably, the temporary fixing composition (I) of the present invention includes a polymer (A) which contains a functional group and a release agent (B) which contains a functional group capable of reacting with the functional group contained in the polymer (A). The temporary fixing composition (I) may also include a thermoplastic resin (C) which does not form a chemical bond by the reaction with the release agent (B).

<Polymer (A)>

The polymer (A) does not have any particular limitation, so long as it is a polymer (other than a polymer corresponding to the release agent (B)) which contains a functional group capable of reacting by, for example, heat and/or light irradiation, with a functional group contained in the release agent (B) to forma chemical bond. Examples of the polymer include rubbers, acrylic-based resins, vinyl alkyl ether resins, polyester resins, polysiloxane resins, polyamide resins, urethane-based resins, which contain the above-mentioned functional group.

In the polymer (A), examples of the functional group capable of reacting with the release agent (B) to forma chemical bond include groups containing a polymerizable double-bond, such as alkenyl groups such as vinyl group and allyl group, (meth)acryloyl group, and maleimide group; epoxy group, and oxetanyl group, and in particular, the groups containing a polymerizable double-bond are preferable, and alkenyl groups are more preferable.

Examples of the polymer (A) containing a polymerizable double-bond include diene polymers such as polyisoprene, polybutadiene, butadiene-isoprene copolymers, isobutylene-isoprene copolymers, acrylonitrile-butadiene copolymers, styrene-butadiene copolymers, styrene-isoprene copolymers, and styrene-isoprene-butadiene copolymers.

The diene polymers preferably have a vinyl bond content of 10-100% and more preferably 20-80%. A diene polymer having a vinyl bond content within the range easily reacts with the release agent (B) to form the release layer (I) which prevents migration of components of the release agent into other layer.

The vinyl bond content refers to as a total percentage (on a mole basis) of 1,2-bond units and 3,4-bond units in conjugated diene compound units incorporated in 1,2-, 3,4-, and 1,4-fashions into the diene polymer. The vinyl bond content can be determined by infrared spectroscopy (Morello method).

The diene polymer usually has a number average molecular weight ($M_n$) of 1,000-100,000 and preferably 1,500-10,000 as measured by gel permeation chromatography (GPC) relative to polystyrene standards.

In the diene polymer, the content of a structural unit derived from a conjugated diene such as isoprene and 1,3-butadiene is preferably 30% by mass or more, more preferably 50% by mass or more for reactivity of the diene polymer and the release agent (B).

Example of commercially available diene polymers containing a functional group capable of reacting with the release agent (B) to form a chemical bond by heating and/or light irradiation include "Ricon 100" (styrene-butadiene rubber with a number average molecular weight of 4500, a styrene content of 25% by mass, and a vinyl bond content of the butadiene portion of 70%), "Ricon 181" (styrene-butadiene rubber with a number average molecular weight of 3200, a styrene content of 28% by mass, and a vinyl bond content of the butadiene portion of 30%), "Ricon 130" (butadiene rubber with a number average molecular weight of 2500 and a vinyl bond content of 28%), "Ricon 131" (butadiene rubber with a number average molecular weight of 4500 and a vinyl bond content of 28%), "Ricon 134" (butadiene rubber with a number average molecular weight of 8000 and a vinyl bond content of 28%), "Ricon 142" (butadiene rubber with a number average molecular weight of 3900 and a vinyl bond content of 55%), "Ricon 150" (butadiene rubber with a number average molecular weight of 3900 and a vinyl bond content of 70%), and "Ricon 154" (butadiene rubber with a number average molecular weight of 5200 and a vinyl bond content of 90%) from SARTOMER; and "LBR-352" (butadiene rubber with a number average molecular weight of 9000) and "L-SBR-820" (styrene-butadiene rubber with a number average molecular weight of 8500) from Kuraray Co., Ltd.

Examples of the polymer (A) containing a polymerizable double-bond may also include alkyl (meth)acrylate polymers containing a polymerizable double-bond. The polymer can be obtained by synthesizing, for example, a (meth) acrylic polymer containing intramolecularly a functional group (hereinafter also referred to as "functional-group-containing (meth)acrylic polymer"), and reacting the polymer with a compound containing intramolecularly a functional group capable of reacting with the above functional group and a polymerizable double-bond (hereinafter also referred to as "functional-group-containing unsaturated compound").

The functional-group-containing (meth)acrylic polymer can be obtained by copolymerizing, for example, an alkyl (meth)acrylate containing usually $C_{2-18}$ alkyl group, and a functional-group-containing monomer by using a usual method. The weight-average molecular weight (Mw) of the functional-group-containing (meth)acrylic polymer is usually about 200,000-2,000,000 as measured by GPC relative to polystyrene standards.

Examples of the functional-group-containing monomer include a carboxyl-group-containing monomer such as (meth)acrylic acid; a hydroxyl-group-containing monomer such as hydroxyethyl (meth)acrylate; an epoxy-group-containing monomer such as glycidyl (meth)acrylate; an isocyanate-group-containing monomer such as isocyanatoethyl (meth)acrylate; an amino-group-containing monomer such as aminoethyl (meth)acrylate.

The functional-group-containing unsaturated compound used for reacting with the functional-group-containing (meth)acrylic polymer may be the same as the above-described functional-group-containing monomers, depending on the functional group of the functional-group-containing (meth)acrylic polymer. For example, when the functional group of the functional-group-containing (meth) acrylic polymer is a carboxyl group, epoxy-group-containing monomers or isocyanate-group containing monomers can be used, and when the functional group is a hydroxyl group, isocyanate-group-containing monomers can be used, and still when the functional group is an epoxy group, carboxyl-group-containing monomers or amide-group-containing monomers such as acrylamide can be used, and still when the functional group is an amino group, epoxy-group-containing monomers can be used.

Examples of the polymer (A) containing a polymerizable double-bond include a polysiloxane containing a polymerizable double-bond such as an alkenyl-group-containing polysiloxane. Examples of the above-mentioned polymer include polymers described in JP-A-2013-179135 and JP-A-2013-232459.

Among the above-described polymers (A), diene polymers are preferable for storage stability of the temporary fixing composition.

The polymer (A) may be used singly or in combination of the two or more kinds.

In the temporary fixing composition (I) of the present invention, the content of the polymer (A) is usually 1-90% by mass, preferably 5-60% by mass, more preferably 10-40% by mass with respect to 100% by mass of the total solid components of the temporary fixing composition (I). The content of the polymer (A) within the above range is preferable for adhesiveness, peelability, and heat resistance of the temporary fixing material.

<Release Agent (B)>

In the present invention, while the temporary fixing composition (I) including the release agent (B) is applied and dried, the release agent (B) migrates to the surface of the coating, resulting in a larger amount of the agent existing on the surface of the coating than in the inside thereof, and hence releasability is imparted to the coated film.

Since the release agent (B) contains a functional group capable of reacting with the polymer (A) to form a chemical bond, it reacts with the polymer (A) by heating and/or light irradiation, being incorporated into the release layer (I), the component of the release agent in the release layer (I) is unlikely to migrate into other layers such as the adhesive layer (II). For this reason, when the substrate material is separated from the support, separation at the boundary between the adhesive layer (II) and the support and separation due to cohesive failure in the adhesive layer (II) are unlikely to occur, and separation at the boundary between the substrate material and the release layer (I) and separation due to cohesive failure in the release layer (I) occur mainly. Accordingly, an only small amount of a residue derived from the temporary fixing material remains on the substrate material after the separation, and even if it remains, it can be removed by a solvent in a short time.

In the release agent (B), a suitable group can be selected as a functional group capable of reacting with the polymer (A) to form a chemical bond, depending on the kind of the polymer (A). Examples of the group include; groups containing a polymerizable double-bond, such as alkenyl groups such as vinyl group and allyl group, and (meth)acryloyl group; epoxy group and oxetanyl group; and acidic groups such as phenolic hydroxyl group and carboxyl group. When the polymer (A) is, for example, a polymer containing a polymerizable double-bond, the functional group contained in the release agent (B) is preferably a group containing a polymerizable double-bond, and more preferably a (meth) acryloyl group. When the polymer (A) contains an epoxy or oxetanyl group, the group contained in the agent is preferably an acidic group such as phenolic hydroxyl or carboxyl group.

The release agent (B) is preferably any of a silicone release agent (B1), a fluorinated release agent (B2), and an aliphatic release agent (B3), which contain a functional group capable of reacting with the polymer (A) to form a chemical bond. It can be used singly or in combination of the two or more kinds.

In the temporary fixing composition (I) of the present invention, the content of the release agent (B) is preferably 0.001-10% by mass, more preferably 0.01-8% by mass, and still more preferably 0.03-6% by mass, with respect to 100% by mass of the total solid components of the temporary fixing composition (I). When the release agent (B) is used in an amount within the range, the substrate material can be retained on the release layer (I) during processing of the substrate material, and the substrate material can be separated from the support without damaging the substrate material.

In addition, the content of the release agent (B) is preferably 0.001-10 parts by mass, more preferably 0.01-8 parts by mass, still preferably 0.1-5 parts by mass, with respect to 100 parts by mass of polymer (A). When the release agent (B) is used in an amount of the range, adhesivity of the temporary fixing material is sufficiently reduced against a force pulling the substrate material or the support, for example, in a direction approximately perpendicular to the substrate surface, enabling separation of the substrate material from the support without damaging the substrate material.

Examples of release agent (B) include compounds which has a structure selected from a diaryl silicone structure, a dialkyl silicone structure, a fluoridated alkyl structure, a fluoridated alkenyl structure, and a $C_8$ or higher alkyl structure, and which contains a functional group capable of reacting with the polymer (A) to form a chemical bond.

<<Silicone Release Agent (B1)>>

The silicone release agent (B1) contains a functional group capable of reacting with a polymer (A) to form a chemical bond. Because the silicone release agent (B1) contains a functional group capable of reacting with a polymer (A) to form a chemical bond, it can be well incorporated into the release layer (I), thereby preventing not only migration of the (B1) into other layers such as the adhesive layer (II), but also contamination of the substrate material by the (B1). The excellent heat resistance can prevent burning of the release layer (I) even during processing at high temperature such as, for example, a temperature of 200° C. or higher.

The silicone release agent (B1) contains preferably a functional group capable of reacting with the polymer (A) to form a chemical bond at a side chain or a terminal of the silicone backbone. Silicone release agents containing a functional group capable of reacting with polymer (A) to form a chemical bond at the terminal are more preferable, because such silicone release agents tend to realize both of high initial adhesiveness and peelability after processing at high temperature.

The number of the functional groups capable of reacting with polymer (A) to forma chemical bond, contained in the silicone release agent (B1) is preferably 1-20, more preferably 2-10, and still preferably 2-8. When the number of the functional groups is equal to or larger than the minimum value of the above range, the silicone release agent (B1) can be incorporated into the release layer (I), thereby preventing migration of the agent (B1) into the other layers such as the adhesive layer (II) and imparting releasability to the release layer (I). When the number of the functional groups is equal to or smaller than the maximum value of the above range, the release layer (I) tends to have sufficient retention of the substrate material.

The weight average molecular weight of the silicone release agent (B1) is, but not limited to, preferably from 300 to 50,000, more preferably from 400 to 10,000, and still more preferably from 500 to 5,000, as measured by GPC relative to polystyrene standards. When the molecular weight is equal to or higher than the minimum value of the above range, the release layer (I) tends to have sufficient heat resistance. When the molecular weight is equal to or lower than the maximum value of the above range, the polymer (A) and the silicone release agent (B1) can be readily mixed.

A method for synthesizing the silicone release agent (B1) is not particularly limited. Examples of the method include a method of introducing the functional group into a silicone resin by hydrosilation reaction of the silicone resin containing a SiH group with a vinyl compound containing a functional group capable of reacting with the polymer (A) to form a chemical bond; and a method of condensing a siloxane compound with a siloxane compound containing a functional group capable of reacting with the polymer (A) to form a chemical bond.

Examples of the silicone release agent (B1) include silicone compounds that have at least one structure selected from diaryl silicone structures and dialkyl silicone structures, and in particular, silicone compounds with a group containing a functional group capable of reacting with the polymer (A) to form a chemical bond, the group being introduced at a side chain and/or a terminal of the silicone backbone, as represented by Formula (I), Formula (II), or Formula (III), are suitable, and silicone compounds with a group containing a functional group capable of reacting with the polymer (A) to form a chemical bond, the group being introduced at the polydimethylsiloxane backbone, are particularly preferable.

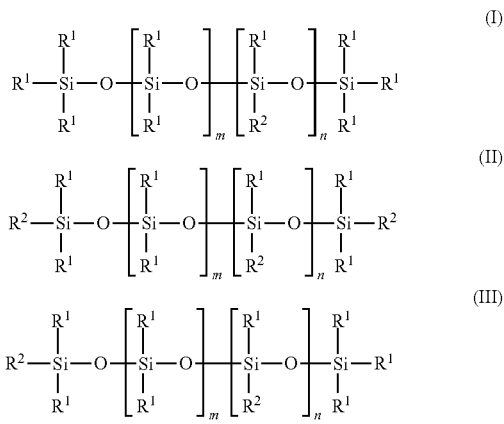

In Formulae (I)-(III), R's are each independently $C_{6-15}$ aryl groups or $C_{1-30}$ alkyl groups. The aryl group is preferably a $C_{6-10}$ aryl group, and the alkyl group is preferably a $C_{1-20}$ alkyl group. Particularly preferably, $R^1$s are each methyl groups.

$R^2$s are groups containing a functional group capable of reacting with the polymer (A) to form a chemical bond and are, for example, polyether-modified or alkyl-modified (meth)acryloyloxy groups. The symbol m is a natural number, which is a value such that the weight average molecular weight of a compound represented by the above-mentioned formulae is within the above-described range. In formula (I), n is an integer of one or more, and an integer of preferably 2-10, more preferably 2-8. In formula (II), n is an integer of 0 or more, and an integer of preferably 0-8, more preferably 0-6. In formula (III), n is an integer of 0 or more, and an integer of preferably 1-9, more preferably 1-7.

In Formulae (I)-(III), the —Si($R^1$)$_2$O— units and the —Si($R^1$)($R^2$)O— units may have a random structure or a block structure.

Examples of commercially available silicone release agents (B1) include, for example, silicone compounds containing a methacryloyloxy group at the both terminals, such as X-22-164, X-22-164AS, X-22-164A, X-22-164B, X-22-164C, and X-22-164E, from Shin-Etsu Chemical Co., Ltd.; silicone compounds containing a methacryloyloxy group at one terminal, such as X-22-174DX, X-22-2426, and X-22-2475, from Shin-Etsu Chemical Co., Ltd.; silicone compounds containing an acryloyloxy group, such as EBE-CRYL350 and EBECRYL1360, from Daicel-Cytec Company, Ltd.; silicone compounds containing an acryloyloxy group, such as AC-SQ TA-100 and AC-SQ SI-20, from TOAGOSEI CO., LTD.; silicone compounds containing a methacryloyloxy group, such as MAC-SQ TM-100, MAC-SQ SI-20, and MAC-SQ HDM, from TOAGOSEI CO., LTD.

The examples also include "Tego Rad 2100" (a penta-functional reactive silicone that contains an alkyl modified acryloyloxy group as a functional group), "Tego Rad 2010" (a penta-functional reactive silicone that contains an acryloyloxy group as a functional group), "Tego Rad 2250" (a difunctional reactive silicone that contains an acryloyloxy group as a functional group), "Tego Rad 2300" (a difunctional reactive silicone that contains an alkyl modified acryloyloxy group as a functional group), and "Tego Rad 2600" (an octa-functional reactive silicone that contains an alkyl modified acryloyloxy group as a functional group), from Evonik Degussa Japan Co., Ltd.; "SILAPLANE FM-0711" (a reactive silicone that contains an alkyl modified acryloyloxy group as a functional group at one terminal), and "SILAPLANE FM-7711" (a reactive silicone that contains an alkyl modified acryloyloxy group as a functional group at the both terminals), from JNC Corp.

<<Fluorinated Release Agent (B2)>>

The fluorinated release agent (B2) contains a functional group capable of reacting with the polymer (A) to form a chemical bond. Examples of the fluorinated release agent (B2) include compounds containing at least one group selected from a fluorinated alkyl structure and a fluorinated alkenyl structure, and a functional group capable of reacting with the polymer (A) to form a chemical bond.

The fluorinated alkyl structure is, for example, a $C_{1-30}$ or preferably $C_{1-20}$ fluorinated alkyl group (a group in which one or more hydrogens contained in an alkyl group are replaced with a fluorine), and particularly preferably a perfluoroalkyl group.

The fluorinated alkenyl structure is, for example, a $C_{3-25}$ or preferably $C_{5-20}$ fluorinated alkenyl group (a group in which one or more hydrogens contained in an alkenyl group are replaced with fluorine) and particularly preferably a perfluoroalkenyl group such as a group represented by Formulae (b2-1) or (b2-2). Note that in the present invention, the groups represented by Formulae (b2-1) or (b2-2) have low polymerization reactivity, and therefore, when the polymer (A) contains a polymerizable double-bond, these groups are not included in examples of functional groups capable of reacting with the polymerizable double-bond to form a chemical bond.

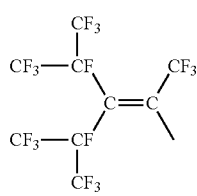

(b2-1)

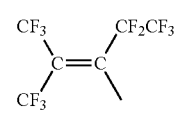

(b2-2)

Preferable examples of the fluorinated release agent (B2) include fluorinated release agents that have a fluorinated alkyl structure and a (meth)acryloyl group, and the compounds represented by Formula (b2-3) are more preferred.

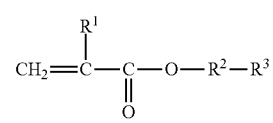

(b2-3)

In Formula (b2-3), $R^1$ is a hydrogen atom or a methyl group, $R^2$ is a direct bond or a $C_{1-20}$ alkylene group, and $R^3$ is a $C_{1-30}$ or preferably $C_{1-20}$ fluorinated alkyl group and more preferably a perfluoroalkyl group. Examples of the compounds represented by Formula (b2-3) include 2,2,3,3,3-pentafluoropropyl acrylate and 2-(perfluorobutylethyl) acrylate.

<<Aliphatic Release Agent (B3)>>

The aliphatic release agent (B1) contains a functional group capable of reacting with the polymer (A) to form a chemical bond. Examples of the aliphatic release agent (B3) include compounds that have a $C_8$ or higher alkyl structure and contain a functional group capable of reacting with the polymer (A) to form a chemical bond. The alkyl structure is, for example, a $C_8$ or higher and preferably $C_{8-40}$ alkyl group, and the specific examples thereof include octyl, decanyl, dodecyl, and octadecyl groups.

Preferable examples of the aliphatic release agent (B3) include aliphatic release agents that have a $C_8$ or higher alkyl structure and contain a (meth)acryloyl group, and compounds represented by Formula (b3-1) is more preferred.

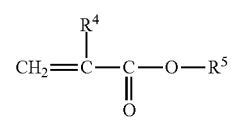

(b3-1)

In Formula (b3-1), $R^4$ is a hydrogen atom or a methyl group, and $R^5$ is a $C_8$ or higher and preferably $C_{8-40}$ alkyl group. Examples of the compounds represented by Formula (b3-1) include LIGHT ESTER L (n-laurylmethacrylate) and LIGHT ESTERS (n-stearyl methacrylate), from Kyoeisha Chemical Co., Ltd.

<Thermoplastic Resin (C)>

The temporary fixing composition (I) of the present invention preferably further contains a thermoplastic resin (C). Examples of the thermoplastic resin (C) include cycloolefin polymers, petroleum resins, novolac resins, and mixtures thereof.

Among them, cycloolefin polymers are preferable. Layers containing a cycloolefin polymer have excellent heat resistance and high resistance against liquid chemicals used in photo-fabrication. For this reason, damage of substrate material itself and members such as a bump formed on the substrate material can be avoided even if a working process under high temperature environments is included in processing of the substrate material.

When thermoplastic resin (C) is used, the content of the polymer (A) in the temporary fixing composition (I) of the present invention is preferably 1-50 parts by mass, more preferably 5-40 parts by mass, particularly preferably 10-30 parts by mass, with respect to 100 parts by mass of the resin (C). The content of the thermoplastic resin (C) within the range is preferable for lowering temperature during fixing temporarily the substrate material on the support and for preventing the substrate material on the support from moving and sliding relative thereto during processing or transporting the substrate material.

<<Cycloolefin Polymer>>

Examples of the cycloolefin polymer which are suitable examples of the thermoplastic resin (C) include addition copolymers of a cyclic olefin compound and a non-cyclic olefin compound, ring-opening metathesis polymers of one or more of cyclic olefin compounds, and hydrogenated polymers of the ring-opening metathesis polymers. Synthesis methods of such cycloolefin polymers are conventionally well-known.

Examples of the cyclic olefin compound include norbornene olefins, tetracyclododecene olefins, dicyclopentadiene olefins, and derivatives thereof. Examples of the derivatives include substituted derivatives which contain one or more selected from alkyl groups, alkylidene groups, aralkyl groups, cycloalkyl groups, a hydroxy group, alkoxy groups, an acetyl group, a cyano group, amide groups, imide groups, silyl groups, aromatic rings, an ether bond, and an ester bond.

The number of carbon atoms of each group in these derivatives is preferably as follows. The alkyl groups preferably have 1 to 20 and more preferably 1 to 10 carbon atoms. The alkylidene group preferably has 1 to 20 and more preferably 1 to 10 carbon atoms. The aralkyl group preferably has 7 to 30 and more preferably 7 to 18 carbon atoms. The cycloalkyl group preferably has 3 to 30 and more preferably 3 to 18 carbon atoms. The alkoxyl group preferably has 1 to 10 carbon atoms.

Suitable examples of the cyclic olefin compound include compounds represented by Formula (C1),

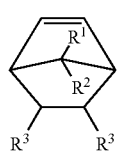

(C1)

In Formula (C1), $R^1$ to $R^3$ are as follows. $R^1$ and $R^2$ are each independently a hydrogen atom or an alkyl group. $R^3$s are each independently a hydrogen atom, an alkyl group, a cycloalkyl group, an aryl group, an aralkyl group, an alkoxyl group, an alkoxycarbonyl group, an aldehyde group, an acetyl group, or a nitrile group. In addition, two $R^3$s may be linked together to form a ring structure such as an alicyclic structure, which may also contain, for example, a substituent illustrated as $R^3$.

The number of carbon atoms in each group in Formula (C1) is preferably as follows. The alkyl group preferably has 1-20 and more preferably 1-10 carbon atoms. The cycloalkyl group preferably has 3-30 and more preferably 3-18 carbon atoms. The aryl group preferably has 6-18 carbon atoms. The aralkyl group preferably has 7-30 and more preferably 7-18 carbon atoms. The alkoxyl group preferably has 1-10 carbon atoms. The alkoxycarbonyl group preferably has 2-11 carbon atoms.

Examples of the non-cyclic olefin compound include linear or branched olefins having 2-20 and preferably 2-10 carbon atoms, and ethylene, propylene, and butene are more preferable, and ethylene is particularly preferable.

<Addition Copolymers>

The addition copolymers of a cyclic olefin compound and a non-cyclic olefin compound is, for example, those which have a structural unit represented by Formula (CI) and a structural unit derived from the non-cyclic olefin compound (a structural unit resulting from the reaction of a polymerizable double-bond contained in the non-cyclic olefin).

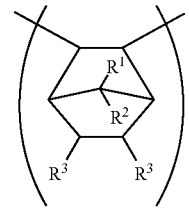

(CI)

The $R^1$ to $R^3$ in Formula (CI) are the same as those defined in Formula (C1).

Examples of commercially available addition copolymers include TOPAS from TOPAS ADVANCED POLYMERS and APEL from Mitsui Chemicals, Inc.

<Ring-Opening Metathesis Polymers and Hydrogenated Products Thereof>

Examples of the ring-opening metathesis polymers of one or more cyclic olefin compounds include polymers having a structural unit represented by Formula (CII), and examples of the hydrogenated polymers of the ring-opening metathesis polymers include polymers having a structural unit represented by Formula (CIII).

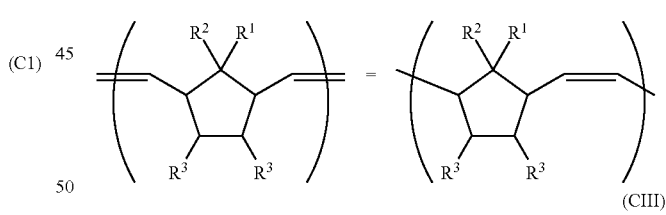

(CII)

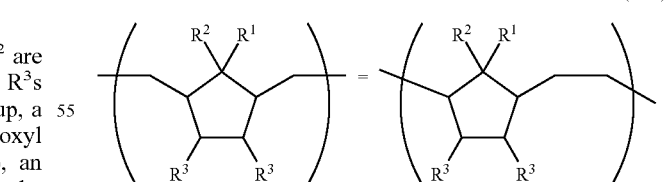

(CIII)

The $R^1$ to $R^3$ in Formulae (CII) and (CIII) are the same as those defined in Formula (1).

Examples of commercially available ring-opening metathesis polymers include ZEONOR and ZEONEX from ZEON Corp. and ARTON from JSR Corp.

The cycloolefin polymer usually has a weight average molecular weight ($M_w$) of 10,000-100,000 and preferably 30,000-100,000 as measured by GPC relative to polystyrene standards. The cycloolefin polymer usually has a molecular weight distribution represented by $M_w/M_n$, of 2-4, and preferably 3-4, wherein $M_n$ is the number average molecular weight of the polymer, as measured by GPC relative to polystyrene standards.

<<Petroleum Resins>>

Examples of petroleum resins which are suitable examples of the thermoplastic resin (C) include C5 petroleum resins, C9 petroleum resins, C5/C9 mixed petroleum resins, cyclopentadiene resins, vinyl-substituted aromatic compound polymers, olefin/vinyl-substituted aromatic compound copolymers, cyclopentadiene compound/vinyl-substituted aromatic compound copolymers, hydrogenated products thereof, and mixtures thereof. Among them, the C5 petroleum resins, the C9 petroleum resins, the C5/C9 mixed petroleum resins, the cyclopentadiene resins, the vinyl-substituted aromatic compound polymers, hydrogenated products thereof, and mixtures thereof are preferable. Preferable examples of the C5 petroleum resins include aliphatic resins, and preferable examples of the C9 petroleum resins include alicyclic resins. Among them, the C9 petroleum resins, the cyclopentadiene resins, hydrogenated products thereof, and mixtures thereof are particularly preferable.

The petroleum resin usually has a weight average molecular weight ($M_w$) of not more than 20,000, preferably 100-20,000, more preferably 200-10,000, and particularly preferably 300-5,000 as measured by GPC relative to polystyrene standards.

<<Novolac Resins>>

The novolac resins which are suitable examples of the thermoplastic resin (C) can be obtained, for example, by condensation of phenols and aldehydes in the presence of an acid catalyst (example: oxalic acid).

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, and β-naphthol.

Examples of the aldehydes include formaldehyde, paraformaldehyde, acetaldehyde, and benzaldehyde.

Specific preferred examples of the novolac resins include phenol/formaldehyde novolac resin, cresol/formaldehyde novolac resin, and phenol-naphthol/formaldehyde novolac resin.

The novolac resin usually has a weight average molecular weight ($M_w$) of 2,000 or more and preferably 2,000-20,000 as measured by GPC relative to polystyrene standards. The molecular weight distribution $M_w/M_n$ of the novolac resin is usually 1-10 and preferably 1.5-5, wherein $M_n$ is the number average molecular weight of the resin as measured by GPC relative to polystyrene standards.

2-2. Temporary Fixing Composition (II)

The temporary fixing composition (II) substantially does not include a release agent (B) containing a functional group capable of reacting with a polymer (A) to forma chemical bond. The temporary fixing composition (II) preferably contains at least one resin selected from at least a thermoplastic resin (C) and a thermosetting resin (D), and more preferably contains the thermoplastic resin (C). The temporary fixing composition (II) may also contain the polymer (A).

In the temporary fixing composition (II), "substantially does not include/comprise a release agent (B)" means that the content of the release agent (B) is usually 0.0005% by mass or less with respect to 100% by mass of the total solid components of the temporary fixing composition (II). The content of the release agent (B) is more preferably 0.0001% by mass or less, and especially preferably 0% by mass.

Further, in the adhesive layer (II) formed of the temporary fixing composition (II), the content of the release agent (B) is usually 0.0005% by mass or less, more preferably 0.0001% by mass or less, particularly preferably 0% by mass, with respect to the total mass of the adhesive layer (II).

In the temporary fixing composition (II), the content of the thermoplastic resin (C) is preferably 10-100% by mass, more preferably 30-95% by mass, and still more preferably 50-90% by mass, with respect to 100% by mass of the total solid components of the temporary fixing composition (II). The content of the thermoplastic resin (C) within the above range is preferable for lowering temperature during fixing temporarily the substrate material on the support and for preventing the substrate material on the support from moving and sliding relative thereto during processing or transporting the substrate material.

In the temporary fixing composition (II), the content of the thermosetting resin (D) is preferably 0-90% by mass with respect to 100% by mass of the total solid components of the temporary fixing composition (II).

In the temporary fixing composition (II), the blending ratio of the polymer (A) to the thermoplastic resin (C) and/or the thermosetting resin (D) (represented by (A):(C)+(D), by mass) is preferably 70:30-0:100, and more preferably 50:50-10:90. The content of the polymer (A), and the thermoplastic resin (C) and/or the thermosetting resin (D) within the range is preferable for lowering temperature during temporary fixing the substrate material on the support and for preventing the substrate material on the support from moving and sliding relative thereto during processing or transporting the substrate material.

In the temporary fixing composition (II), specific examples and preferred examples of the polymer (A) and the thermoplastic resin (C) are as described in the section of "2-1. Temporary fixing composition (I)."

Examples of the thermosetting resin (D) include epoxy resins.

2-3. Preparation of Temporary Fixing Compositions (I) and (II)

The temporary fixing compositions (I) and (II) can be prepared by using a known apparatus used to process thermoplastic resins, such as, for example, a twin-screw extruder, a single-screw extruder, a continuous kneader, a roll kneader, a pressure kneader, or a Banbury mixer.

In preparation of the temporary fixing compositions (I) and (II), a solvent (E) may be used in order to allow the temporary fixing compositions to exhibit a viscosity suitable for application. Examples of the solvent (E) include hydrocarbons such as xylene, limonene, mesitylene, dipentene, pinene, bicyclohexyl, cyclododecene, 1-tert-butyl-3,5-dimethylbenzene, butylcyclohexane, cyclooctane, cycloheptane, cyclohexane, and methylcyclohexane, alcohols/ethers such as anisole, propylene glycol monomethyl ether, dipropylene glycol methyl ether, diethylene glycol monoethyl ether, and diglyme, esters/lactones such as ethylene carbonate, ethyl acetate, n-butyl acetate, ethyl lactate, ethyl 3-ethoxypropionate, propylene glycol monomethyl ether acetate, diethylene glycol monoethyl ether acetate, propylene carbonate, and γ-butyrolactone, ketones such as cyclopentanone, cyclohexanone, methyl isobutyl ketone, and 2-heptanone, and amides/lactams such as N-methyl-2-pyrrolidinone.

The inclusion of the solvent (E) in the temporary fixing compositions (I) and (II) facilitates adjustment of the viscosity of the compositions, and thus facilitates formation of the temporary fixing material on the substrate material or the support. For example, the solvent (E) can be used so that the total content of all the components, excluding the solvent (E), of the temporary fixing compositions (I) and (II) is usually from 5 to 70% by mass and more preferably from 15 to 50% by mass.

The temporary fixing compositions (I) and (II) may contain particles of metal oxides such as aluminum oxide, zirconium oxide, titanium oxide, and silicon oxide, an antioxidant, a polymerization inhibitor, an UV absorber, an adhesion aid, and crosslinked polystyrene particles, as necessary.

The temporary fixing composition (I) may also contain a cross-link promoter such as a radical polymerization initiator or an acid generator in order to promote a reaction between the polymer (A) and the release agent (B) containing a functional group capable of reacting with the polymer (A) to form a chemical bond.

3. Method for Treating Substrate Material

A method for treating the substrate material of the present invention includes <1> a step of fixing temporarily the substrate material on a support via the temporary material to obtain a stack, <2> a step of processing the substrate material and/or transporting the stack, <3> a step of separating the substrate material from the support, and as necessary, <4> a step of removing the temporary fixing material remaining on the substrate material after the separation.

The respective steps are hereinafter referred to as steps <1>-<4>.

3-1. Step <1>

In the step <1>, a substrate material can be, for example, fixed temporarily on a support by (1-1) forming the temporary fixing material as described above on a surface of the support and/or the substrate material and then bonding the substrate material to the support via the temporary fixing material. Alternatively, a substrate material can be temporarily fixed on a support by (1-2) forming the temporary fixing material described above on a surface of the support and forming the substrate material such as a resin coating on the temporary fixing material. The substrate material may be surface-treated, as necessary.

Examples of a method of forming the temporary fixing material include (i) a method of forming the respective layers for the temporary fixing material directly on the support and/or the substrate material and (ii) a method of forming the respective layers for the temporary fixing material with a uniform thickness on a film such as a release-treated polyethylene terephthalate film and then transferring the respective layers onto the support and/or the substrate material by lamination. The method (i) is preferable for uniformity in film thickness.

Examples of a method for applying the temporary fixing compositions that form the respective layers for the temporary fixing material include spin coating and inkjet printing. Examples of the spin coating, for example, include spin-coating the temporary fixing compositions at a rate of rotation of 300-3,500 rpm and preferably 500-1,500 rpm and an acceleration of 500-15,000 rpm/sec, for a rotation duration of 30-300 seconds.

After the temporary fixing compositions are applied to form the coatings, the coatings can be, for example, heated by a heater such as a hot plate to evaporate the solvent. For example, the heating conditions are such that the temperature is usually 150-275° C. and preferably 150-260° C., and the duration is usually 2-15 minutes and preferably 3-15 minutes. In particular, the heating condition in forming the release layer (I) is more preferably 150-250° C. for allowing the reaction of the polymer (A) with the release agent (B) to proceed efficiently.

Examples of a method for bonding the substrate material to the support in the method (i) include a method of forming the release layer (I) on the substrate material, forming the adhesive layer (II) on the support, and bonding the release layer (I) and the adhesive layer (II) so that the layers become in contact with each other; a method of forming the release layer (I) and the adhesive layer (II) on the substrate material and bonding the support to the adhesive layer (II); and a method of forming the adhesive layer (II) and the release layer (I) on the support, and bonding the substrate material to the release layer (II). The temperature in these methods is selected as desired depending on ingredients of the temporary fixing composition, the application method, and others. In this way, the substrate material is firmly retained onto the support via the temporary fixing material. Pressure-bonding the substrate material to the support may be carried out under a condition of, for example, a temperature of 150-300° C. for a duration of 1-5 minutes under a pressure of 0.01-5 MPa.

Examples of the substrate material to be processed (transported) include semiconductor wafers, glass substrates, resin substrates, metal substrates, metal foils, polishing pads, and resin coatings. The semiconductor wafers usually include components such as bumps, wires, and insulating films formed thereon. Examples of the resin coatings include films containing an organic component as a major ingredient, and the specific examples thereof include photosensitive resin films formed of a photosensitive material, insulating resin films formed of an insulating material, and photosensitive insulating resin films formed of a photosensitive insulating resin material. Examples of the support include those that are handled easily and have a hard and flat surface, such as glass substrates and silicon wafers.

When the release layer (I) is formed on a substrate material, the surface of the substrate material may be pretreated to allow the temporary fixing material to spread evenly over the surface. Examples of a method for the surface treatment include a method of previously applying a surface treatment agent to the surface of the substrate material.

Examples of the above-mentioned surface treatment agent include coupling agents, such as, for example, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-trimethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, and hexamethyldisilazane.

3-2. Step <2>

As described above, the step <2> is a step of processing the substrate material fixed temporarily on the support and/or transporting a resultant stack. The transportation step is a step of transporting the substrate material such as a semiconductor wafer from one apparatus to the other apparatus, together with the support. Examples of the processing of the substrate material fixed temporarily on the support in the manner described above include dicing; thinning of substrate materials, such as back-grinding; and photo-fabrication including one or more treatments selected from etching, sputtered film formation, plating, and reflow plating.

The processing of the substrate material may be carried out at any temperature so long as retention of the temporary fixing material is not lost.

3-3. Step <3>

After processed or transported, the substrate material is separated from the support by applying a force to the substrate material or the support. Examples of the separation include a method of applying a force parallel to a surface of the substrate material to the substrate material or the support to separate the substrate material from the support; and a method of fixing one of the substrate material and the support and lifting the other at a predetermined angle relative to the direction parallel to a surface of the substrate material to separate the substrate material from the support. The latter method is preferable, because the separation successfully occurs in the release layer (I) of the temporary fixing material and is feasible at about room temperature.

In particular, it is preferable that a force is applied approximately perpendicularly to a surface of the substrate material to separate the substrate material or the support. The phrase "a force is applied approximately perpendicularly to a surface of the substrate material" means that a force is usually applied at an angle, relative to a z axis which is an axis perpendicular to the surface of the substrate material, of from 0°-60°, preferably from 0°-45°, more preferably from 0°-30°, still more preferably from 0°-5°, and still more preferably 0°, i.e., perpendicularly to the surface of the substrate material.

Exemplary aspects of the separation include a method of usually applying a pressure of 0.0001-100 MPa, preferably 0.001-30 MPa, and more preferably 0.005-1 MPa approximately perpendicularly to a surface of the substrate material to separate the substrate material or the support. An exemplary separation method can be carried out in a mode (hook pull mode) in which a periphery of the substrate material or of the support is lifted (part or all of the periphery can be separated from the temporary fixing material), and then the separation is made proceed gradually from the periphery toward the center of the substrate material or the support while applying a force approximately perpendicularly to a surface of the substrate material. In the present invention, the substrate material can be separated from the support using such a peel force and such a separating method.

The separation of the substrate material or the support can be carried out usually at 5-100° C., preferably 10-45° C., more preferably 15-30° C. This temperature means the temperature of the support.

To prevent damage of the substrate material during separating the substrate material, a reinforcing tape such as, for example, a commercially available dicing tape can be attached to the surface of the substrate material, opposite from the temporary fixation surface to the support.

As described above, in the present invention, as the temporary fixing material include the release layer (I) and the adhesive layer (II), and the separation mainly occurs in the release layer (I), only a small amount of a residue derived from the temporary fixing material remains on the substrate material. For this reason, even if the residue derived from the temporary fixing material remains on the substrate material, it can be removed by using a solvent in a short time.

3-4. Step <4>

When the temporary fixing material remains on the substrate material after the separating step, it can be removed by cleaning the substrate material with a solvent. Examples of the cleaning method include a method of soaking the substrate material in a cleaning liquid, a method of spraying a cleaning liquid to the substrate material, and a method of irradiating ultrasonic wave to the substrate material soaked in a cleaning liquid. The cleaning liquid may preferably have a temperature of 10-80° C. and more preferably 20-50° C. without limitation.

Examples of the solvent include hydrocarbons such as xylene, limonene, mesitylene, dipentene, pinene, bicyclohexyl, cyclododecene, 1-tert-butyl-3,5-dimethylbenzene, butylcyclohexane, cyclooctane, cycloheptane, cyclohexane, and methylcyclohexane, alcohols/ethers such as anisole, propylene glycol monomethyl ether, dipropylene glycol methyl ether, diethylene glycol monoethyl ether, and diglyme, esters/lactones such as ethylene carbonate, ethyl acetate, n-butyl acetate, ethyl lactate, ethyl 3-ethoxypropionate, propylene glycol monomethyl ether acetate, diethylene glycol monoethyl ether acetate, propylene carbonate, and γ-butyrolactone, ketones such as cyclopentanone, cyclohexanone, methyl isobutyl ketone, and 2-heptanone, and amides/lactams such as N-methyl-2-pyrrolidinone.

In this way, the substrate material can be separated from the support.

4. Semiconductor Device

A semiconductor device of the present invention is obtained by the method for treating the substrate material according to the present invention. Because the temporary fixing materials as described above can be easily removed when a semiconductor device (for example, a semiconductor element) is separated, the semiconductor device exhibits significantly reduced contamination (for example, staining and burning) due to the temporary fixing material.

EXAMPLES

Now, the present invention will be more specifically described with reference to Examples, although the present invention is not limited to the examples. As used in the following Examples and others, "parts" represents "parts by mass" unless otherwise mentioned.

The weight average molecular weight ($M_w$) and the number average molecular weight ($M_n$) of polymers and resins were measured on, for example, "HLC-8220-GPC" instrument from Tosoh Corp. with GPC columns (two G2000 HXL columns, one G3000 HXL column, and one G4000 HXL column) from Tosoh Corp., relative topolystyrene standards.

Example 1A

A hundred parts of a cycloolefin polymer (under the trade name of "ARTON R5300" from JSR Corp.), 20 parts of a liquid styrene-butadiene rubber (under the trade name of "RICON100" from SARTOMER), 0.1 part of acrylate-modified polysiloxane (under the trade name of "Tego Rad2010" from Evonik Degussa Japan Co., Ltd.), and 300 parts of xylene were mixed at 25° C. to prepare a temporary fixing composition of Example 1A.

Examples 2A-5A and Preparation Examples 1A-2A

Temporary fixing compositions 2-8 of Examples 2A-5A and Preparation Examples 1A-3A were prepared in the same manner as in Example 1A except that the blended composition in Example 1A was changed as indicated in Tables 1.

TABLE 1

| | | Example 1A temporary fixing composition 1 | Example 2A temporary fixing composition 2 | Example 3A temporary fixing composition 3 | Example 4A temporary fixing composition 4 | Example 5A temporary fixing composition 5 | Preparation example 1A temporary fixing composition 6 | Preparation example 2A temporary fixing composition 7 | Preparation example 3A temporary fixing composition 8 |
|---|---|---|---|---|---|---|---|---|---|
| polymer (A) | polymer A1 | 20 | 20 | 20 | | | 20 | 20 | 20 |
| | polymer A2 | | | | 20 | | | | |
| | polymer A3 | | | | | 20 | | | |
| release agent (B) or other release agent | compound B1-1 | 0.1 | | 0.1 | | 0.1 | | | |
| | compound B1-2 | | 0.1 | | 0.1 | | | | |
| | compound BR1 | | | | | | | 0.1 | |
| | compound BR2 | | | | | | | | 0.1 |
| thermoplastic resin(C) | resin AR1 | 100 | 100 | | | 100 | 100 | 100 | 100 |
| | resin AR2 | | | 100 | 100 | | | | |
| solvent (E) | xylene | 300 | | | | 300 | | 300 | |
| | mesitylene | | 300 | 300 | 300 | | 300 | | 300 |

The unit of the value of each component is parts by mass.

Now, the individual ingredients used in Examples or Preparation examples will be described in detail.

Polymer (A)

A1: liquid styrene-butadiene rubber (under the trade name "RICON100" from SARTOMER, number average molecular weight=4500, styrene content=25% by mass, vinyl bond content of butadiene portion=70%).

A2: liquid styrene-butadiene rubber (under the trade name "RICON181" from SARTOMER, number average molecular weight=3200, styrene content=28% by mass, vinyl bond content of butadiene portion=30%).

A3: liquid styrene-butadiene rubber (under the trade name "L-SBR-820" from Kuraray Co., Ltd., resin containing an ethylenically unsaturated double-bond, number average molecular weight=8500).

Release Agent (B)

B1-1: acrylate-modified polysiloxane (under the trade name "Tego Rad2010" from Evonik Degussa Japan Co., Ltd., penta-functional reactive silicone containing an acryloyloxy group).

B1-2: acrylate-modified polysiloxane (under the trade name "Tego Rad2100" from Evonik Degussa Japan Co., Ltd., penta-functional reactive silicone containing an alkyl-modified acryloyloxy group).

BR1: polyether-modified polysiloxane (under the trade name "Tego Wet270" from Evonik Degussa Japan Co., Ltd., compound not containing a functional group capable of reacting with a polymerizable double-bond contained in the polymer (A1) to form a chemical bond but having a dialkyl silicone structure and a polyoxyalkylene structure).

BR2: fluororesin (under the trade name "Ftergent 209F" from NEOS COMPANY LIMITED), compound not containing a functional group capable of reacting with a polymerizable double-bond contained in the polymer (A1) to form a chemical bond but having a hexafluoropropene structure and a polyoxyalkylene structure).

Thermoplastic Resin (C)

AR1: trade name "ARTON R5300" from JSR Corp.
AR2: trade name "ZEONEX 480R" from ZEON Corp.

Example 1B

The temporary fixing composition 1 was spin-coated onto a 4-inch silicon wafer (substrate material) having a plurality of bumps thereon, and the spin-coated wafer was heated on a hot plate in ambient atmosphere at 160° C. for 5 minutes and then in nitrogen atmosphere at 230° C. for 10 minutes to obtain a substrate having a coating (release layer) with a thickness of 10 µm. The resultant substrate was cut into 2 cm by 2 cm pieces to obtain a substrate 1A that had the release layer.

The bumps had a length of 10 µm, a width of 10 µm, and a height of 5 µm, and the lower half of the bumps on the silicon wafer side was a copper pillar portion and the upper half was a Sn—Ag alloy solder portion.

The temporary fixing composition 6 was also spin-coated onto a 4-inch silicon wafer (support), and the spin-coated wafer was heated on a hot plate in ambient atmosphere at 160° C. for 5 minutes and then in nitrogen atmosphere at 230° C. for 10 minutes to obtain a substrate having a coating (adhesive layer) with a thickness of 40 µm. The resultant substrate was cut into 1.5 cm by 1.5 cm pieces to obtain a substrate 1B that had the adhesive layer.

The substrate 1A and the substrate 1B were bonded together so that the release layer became contact with the adhesive layer, and a pressure of 0.02 MPa was applied at 180° C. for 60 seconds using a die bonder, to fix temporarily the silicon wafer (substrate material) and the silicon wafer (support) via the temporary fixing material consisting of the release layer and the adhesive layer.

A shear force was applied to the substrate material (at a rate of 500 µm/sec and 23° C.) in the direction parallel to a surface of the substrate material using a universal bond tester (under the trade name of "DAGE 4000" from Dage Japan Co., Ltd.), and it was confirmed that even when a pressure of 2 MPa was applied, the silicon wafer (substrate material) and the silicon wafer (support) remained bonded together (temporarily fixed) without any displacement.

[Peelability Test]

Next, a peelability test was carried out. A force was applied to the substrate material (at a rate of 500 μm/sec and 23° C.) along an axis (Z axis) perpendicular to a surface of the substrate material (at 0° relative to the Z axis) using a universal bond tester (under the trade name of "DAGE 4000" from Dage Japan Co., Ltd.) in a hook pull mode. As a result, the silicon wafer (substrate material) was able to be separated from the silicon wafer (support) by a pressure of less than 0.2 MPa. No residue of the temporary fixing material remained on the silicon wafer (substrate material) after the separation, and it was confirmed that the separation was able to be achieved at the boundary between the silicon wafer (substrate material) and the release layer. The condition of the bumps was also observed by naked eyes. As a result, it was confirmed that the bumps were not distorted and the separation was successfully achieved. This peelability test was carried out ten times, and the number of tests, out of the ten tests, in which the separation was succeeded with no residue of the temporary fixing material on silicon wafer (substrate material) is shown as an evaluation result in Table 2.

[Migration Test]

Next, a migration test was carried out. Adhesiveness of the temporary fixing material on the silicon wafer (support) to the silicon wafer (support) after separation was evaluated according to JIS K5600-5-6. Because the temporary fixing materials in 100 square regions out of 100 square regions on the silicon wafer (support) were left adhered to the silicon wafer (support), the release agent in the release layer was considered to have not migrated into the adhesive layer.

Examples 2B-5B and Comparative Examples 1B-2B

The above tests were also carried out in the same manner as in Example 1B except that the temporary fixing composition was changed as indicated in Table 2. The results are shown in Table 2. Note that the migration tests of Comparative examples 1B-2B were carried out for samples which were obtained with no residue by separation in the peelability test. Because no temporary fixing materials in 100 square regions on the silicon wafer (support) were left adhered to the silicon wafer (support) in the migration test of the Comparative examples 1B-2B, the release agent in the release layer was considered to have migrated into the adhesive layer.

The invention claimed is:

1. A method for treating a substrate material, comprising
   <1> a step of obtaining a stack by fixing temporarily a substrate material on a support via a temporary fixing material comprising a temporary fixing material layer (I) and a temporary fixing material layer (II), wherein the temporary fixing material layer (I) is in contact with a support-facing surface of the substrate material, and the temporary fixing material layer (II) is formed on a support-facing surface of the layer (I), and
   the temporary fixing material layer (I) is formed of a temporary fixing composition comprising a polymer (A) and a release agent (B) wherein the polymer (A) contains a polymerizable double-bond and the release agent (B) comprises a group containing a polymerizable double-bond capable of reacting with the polymer (A) to form a chemical bond;
   <2> a step of processing the substrate material, and/or transporting the stack; and
   <3> a step of separating the substrate material from the support.

2. The method for treating a substrate material according to claim 1, wherein the release agent (B) is at least one selected from a silicone release agent (B1), a fluorinated release agent (B2), and an aliphatic release agent (B3).

3. The method for treating a substrate material according to claim 1, wherein the release agent (B) comprises at least one structure selected from a diaryl silicone structure, a dialkyl silicone structure, a fluorinated alkyl structure, a fluorinated alkenyl structure, and a $C_8$ or higher alkyl structure, and comprises the group containing the polymerizable double-bond capable of reacting with the polymer (A) to form the chemical bond.

4. The method for treating a substrate material according to claim 1, wherein the polymer (A) is at least one selected from a diene polymer comprising a polymerizable double-bond, an alkyl ester (meth)acrylate polymer comprising a polymerizable double-bond, and a polysiloxane comprising a polymerizable double-bond.

5. The method for treating a substrate material according to claim 1, wherein the temporary fixing material layer (II) is formed of a temporary fixing composition which comprises at least one resin selected from a thermoplastic resin (C) and a thermosetting resin (D), and which does not comprise the release agent (B) which comprises the group

TABLE 2

| | temporary fixing composition on substrate material (composition used for forming release layer) | temporary fixing composition on support (composition used for forming adhesive layer) | peelability test number of tests in which separation succeeded with no residue | migration test |
|---|---|---|---|---|
| Example 1B | temporary fixing composition 1 | temporary fixing composition 6 | 10/10 | 100/100 |
| Example 2B | temporary fixing composition 2 | temporary fixing composition 6 | 10/10 | 100/100 |
| Example 3B | temporary fixing composition 3 | temporary fixing composition 6 | 10/10 | 100/100 |
| Example 4B | temporary fixing composition 4 | temporary fixing composition 6 | 10/10 | 100/100 |
| Example 5B | temporary fixing composition 5 | temporary fixing composition 6 | 10/10 | 100/100 |
| Comparative example 1B | temporary fixing composition 7 | temporary fixing composition 6 | 9/10 | 0/100 |
| Comparative example 2B | temporary fixing composition 8 | temporary fixing composition 6 | 8/10 | 0/100 | containing the polymerizable double-bond capable of reacting with the polymer (A) to form the chemical bond.

* * * * *